United States Patent [19]

Hill

[11] 4,032,850
[45] June 28, 1977

[54] COAXIAL BALUN WITH DOUBLY BALANCED HETERODYNE CONVERTER

[75] Inventor: Joseph Caldwell Hill, N. Billerica, Mass.

[73] Assignee: Varian Associates, Palo Alto, Calif.

[22] Filed: Jan. 12, 1976

[21] Appl. No.: 648,065

[52] U.S. Cl. .............................. 325/446; 325/449; 333/26

[51] Int. Cl.² .................... H04B 1/26; H03D 7/14; H02M 5/20

[58] Field of Search .......... 325/442, 445, 446, 449, 325/373, 376, 381, 385, 386, 128, 178; 333/25, 26; 343/821, 859

[56] References Cited

UNITED STATES PATENTS

| | | | |
|---|---|---|---|
| 2,606,964 | 8/1952 | Gluyas, Jr. | 333/26 |
| 3,656,071 | 4/1972 | Woodward | 333/26 |
| 3,818,385 | 6/1974 | Mouw | 325/446 |

Primary Examiner—Robert L. Griffin
Assistant Examiner—Marc E. Bookbinder
Attorney, Agent, or Firm—Stanley Z. Cole; Richard B. Nelson; Robert K. Stoddard

[57] ABSTRACT

A coaxial line has a conductive surrounding shield connected from a first to a second point thereon. The outer conductor of the coaxial line shield is discontinuous at an intermediate point inside the shield so that it has two intermediate ends or terminals therein. A radio frequency signal applied to one end of the electrically unbalanced coaxial line will be supplied on the balanced intermediate terminals through a broadband transformation by the coaxial line with its shield, which constitutes a balun (balancing transformer). The length of each part of the coaxial line, from each intermediate terminal to the first and second points, is preferably one-quarter wavelength at the center frequency of an applied frequency band.

The coaxial line may be used with another coaxial line mounted orthogonally to the first line, with both lines mounted within a common enclosure or shield, thereby to provide a dual balun. The intermediate terminals of the dual balun can be connected to opposite terminals of a four-diode bridge mounted between the baluns, thereby to form a doubly balanced heterodyne converter. A heterodyne output signal is derived at the intermediate terminals of one of the coaxial baluns by means of two quarter wave lines which are connected at their ends remote from the balun to form a heterodyne output terminal. The coaxial balun is capacitively coupled to the joint shield at its first and second points, to avoid shorting the heterodyne output circuit.

8 Claims, 8 Drawing Figures

PRIOR ART BALUN

IMPROVED BALUN

COAXIAL BALUN WITH ENCLOSURE SHIELD

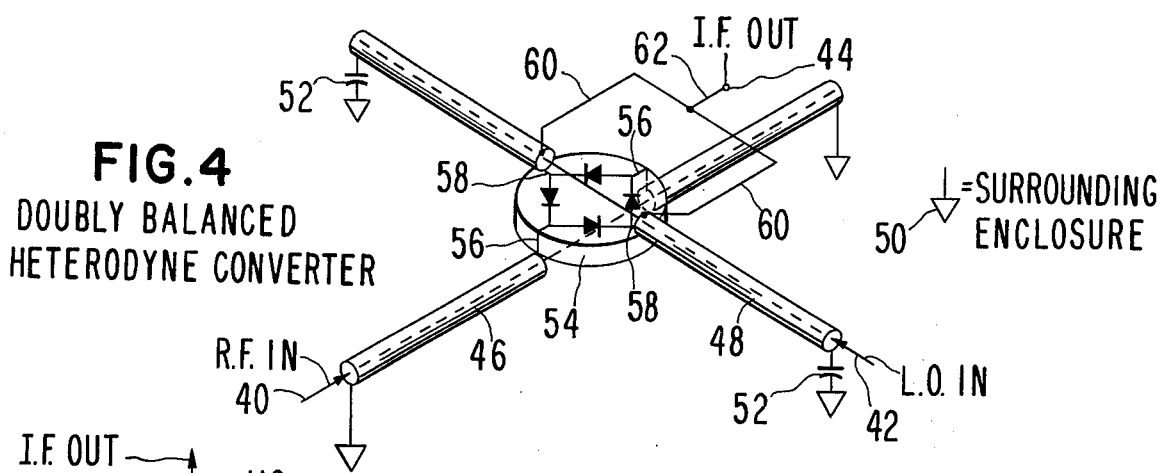
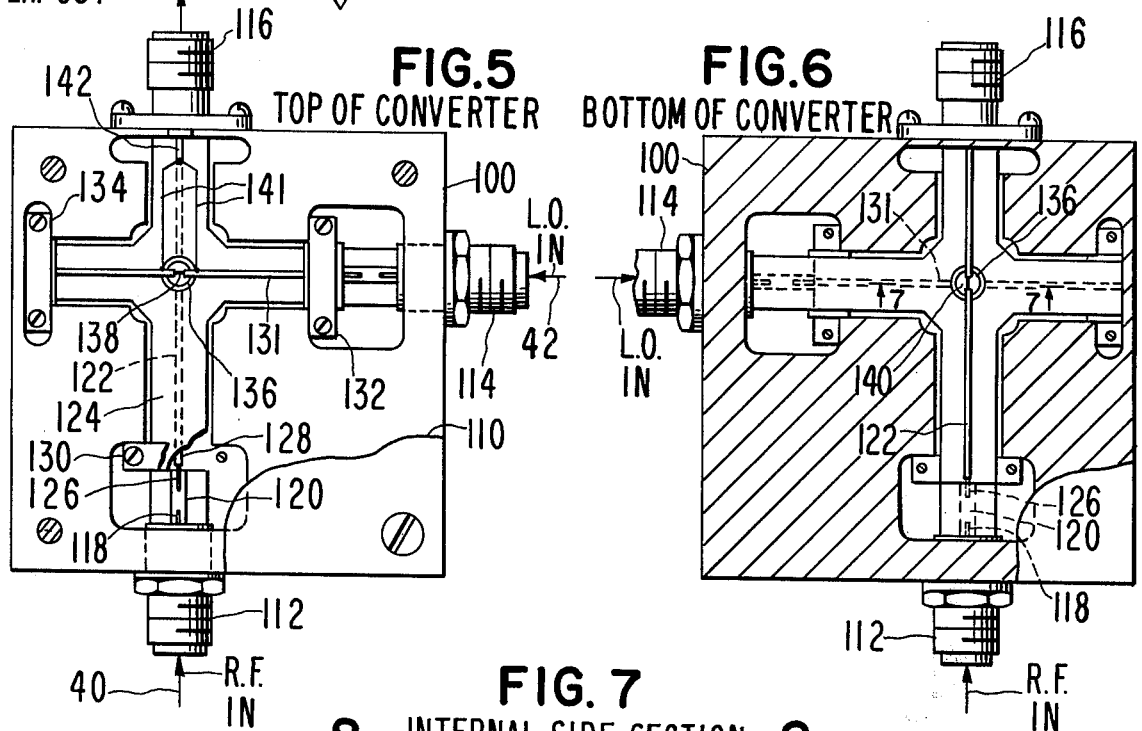
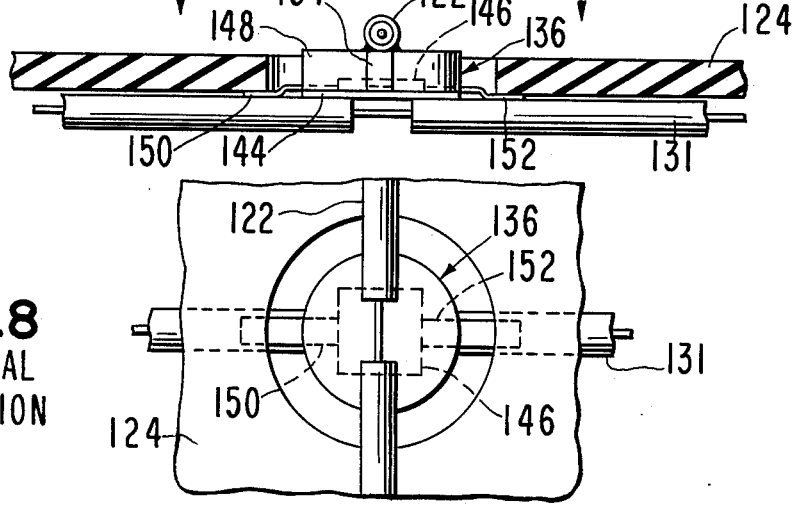

COAXIAL BALUN WITH DOUBLY BALANCED HETERODYNE CONVERTER

FIELD OF INVENTION

This invention relates to radio frequency transformers and mixers and particularly to coaxial baluns (balancing transformers) and heterodyne converters employing same to perform a doubly balanced conversion.

REFERENCES AND RELEVANT PRIOR ART

Very High-Frequency Techniques, Radio Research Lab. Harvard University (McGraw-Hill 1947) pp. 85–88. U.S. Pat. No. 3,638,126, 25 Jan. 1972, Spacek. U.S. Pat. No. 3,831,097, 20 Aug. 1974, Neuf. U.S. Pat. No. 3,512,090, 12 May 1970, Mouw. U.S. Pat. No. 3,245,010, 5 Apr. 1966, Oliver. U.S. Pat. No. 3,492,603, 27 Jan. 1970, Frederick, Jr.. U.S. Pat. No. 3,652,941, 28 Mar. 1972, Neuf.

DESCRIPTION OF PRIOR ART

Balancing transformers, known as baluns, are widely used in radio frequency circuits to convert a signal on an unbalanced line, that is a line in which one side is connected to a ground or common terminal in a system, to a signal on a balanced line, that is a line in which neither side is connected to ground and hence in which both sides are in effect electrically symmetrical with respect to ground. Alternatively a balanced to unbalanced conversion can also be effected with a balun.

Baluns are often used with heterodyne converters. As is well known, a heterodyne converter combines two radio frequency (RF) signals of different frequencies to synthesize "envelope" signals which are at the sum and difference frequencies of the two rf input signals. These envelope signals have simultaneously balanced excursions with respect to ground and thus are not directly usable, but they can be converted to a usable form with a non-linear device such as a diode. It is well known that if two signals to be heterodyned are supplied on balanced lines to such a combiner rectifier, substantially greater isolation between the two signals will be provided, fewer intermodulation signals will be produced, the electrical conversion will be more efficient, and the converter will have much broader bandwidth capabilities. A heterodyne converter which combines its two input signals on balanced lines is referred to as doubly balanced.

Heretofore one type of doubly balanced heterodyne converter employed a pair of toroid transformers to effect the unbalanced to balanced conversions of the two input signals, plus a four-diode bridge (also known as a diode quad) with the two signals being applied on balanced lines across different opposite corners of the bridge. The toroid transformer type doubly balanced heterodyne converter suffers from the serious drawbacks of low efficiency (due to losses in the ferrite cores of the toroid transformers) and severely restricted upper frequency response due to the inability of toroid transformers to handle higher radio frequency signals.

Also, tapered line transformers have been employed to convert signals on unbalanced ground plane input lines to balanced parallel transmission lines; the output of the balanced parallel transmission lines were coupled to the diode quad. One such device is shown in the above referenced Neuf U.S. Pat. No. 3,652,941. While such tapered lines are broadband in the microwave region, blocking capacitors and inductive returns must be used in order to decouple the heterodyne intermediate frequency (IF) signal. The capacitive and inductive components introduce mismatches and losses, which decrease efficiency. Also the transmission lines are open and hence do not adequately contain the radio frequency energy, thereby resulting in additional losses and in radiation cross coupling, in turn creating local oscillator to signal leakage which actually may be greater than that obtained with an unbalanced heterodyne converter. Thus tapered line doubly balanced mixers have serious inherent disadvantages.

Coaxial baluns have been known, e.g., from the above-referenced Radio Research Laboratory text, but these have never been used for driving balanced mixers, insofar as applicant is aware. Also, the coaxial baluns heretofore used suffered from mechanical disadvantages which become redoubtable when coaxial lines of extremely small diameter, i.e., on the order of 1 millimeter or less, are used. Specifically, with the baluns shown in the aforecited text, it is necessary to make separate contacts to both the center and outer conductors of the coaxial line in an extremely small area with a twin lead transmission line, a difficult mechanical task as will be recognized by those skilled in the art.

Accordingly, several objects of the present invention are to provide a new and improved doubly balanced heterodyne converter, to provide a doubly balanced heterodyne converter employing essentially lossless transformers which have broad bandwidth, to provide a new type of balun, and to provide a converter with greatly increased isolation between input lines, to provide a converter with reduced intermodulation effects, and to provide a converter which is substantially easier to construct. Further objects and advantages of the invention will become apparent from a consideration of the ensuing description thereof.

DRAWINGS

FIG. 4 is a combined schematic and isometric diagram of a doubly balanced heterodyne converter according to the invention.

FIGS. 5 to 8 are top, bottom, internal side section and internal top section views of a converter built according to the principles employed in the converter of FIG. 4.

Figure 1:
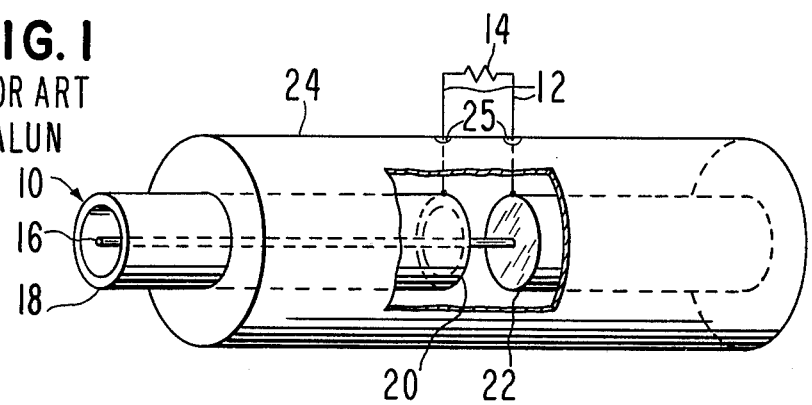
FIG. 1 shows a prior art coaxial balun.

| Reference Numerals | | | |
|---|---|---|---|
| 10 | coaxial line | 110 | cover of 100 |
| 12 | balanced lines | 112 | RF coaxial input terminal |
| 14 | load impedance | 114 | LO coaxial input terminal |
| 16 | center conductor of 10 | 116 | IF coaxial output terminal |
| 18 | outer conductor of 10 | 118 | center conductor of 112 |
| 20 | termination of 18 | 120 | conductive strip |
| 22 | end conductor | 122 | RF coaxial line |
| 24 | conductive shield | 124 | insulating board |
| 26 | removed portion of 18' | 126 | center conductor of 122 |
| 28 | end section of 18' | 128 | outer conductor of 122 |
| 30 | connection of 28 to 24 | 130 | conductive clamp |
| 32 | enclosure shield | 131 | LO coaxial line |
| 40 | RF input signal | 132 | proximal insulating clamp |

| | | | |
|---|---|---|---|
| 42 | LO input signal | 134 | for 131<br>distal insulating clamp for 131 |
| 44 | IF output signal | 136 | diode quad |
| 46 | RF coaxial line | 138 | interruption of 131 |
| 48 | LO coaxial line | 140 | interruption of 122 |
| 50 | surrounding enclosure | 141 | quarter wave lines |
| 52 | coupling capacitor | 142 | IF output terminal |
| 54 | diode quad | 144 | substrate of 136 |
| 56 | balanced lines from 46 | 146 | chip of 136 |
| 58 | balanced lines from 48 | 148 | encapsulant of 136 |
| 60 | quarter wave sections | 150 | lead of 136 |
| 62 | IF output terminal | 152 | lead of 136 |
| 100 | enclosure | 154 | lead of 136 |

FIG 1 — PRIOR ART COAXIAL BALUN

The prior art coaxial balun of FIG. 1 (sometimes termed a "bazooka") will not be discussed in detail since its mode of operation is described on pp. 86–87 of the aforecited Radio Research Laboratory reference. Basically the balun comprises a coaxial line 10 which is designed to receive an applied input signal. Coaxial line 10 is unbalanced since the outer conductor 18 thereof is grounded or regarded as a common terminal. The balun serves to convert the signal to balanced form and supply it on a pair of output lines 12 which are balanced with respect to ground. Lines 12 are terminated by an impedance 14 which may be a load impedance or a non-linear device for detecting an envelope of the input signal.

Coaxial line 10 has a center conductor 16 which is insulated and mechanically spaced from outer conductor 18 by a spacer of Teflon dielectric or any other suitable dielectric (not shown). Outer conductor 18 terminates at 20, but center conductor 16 extends beyond and is electrically connected to an end conductor 22 comprising a stub or other solid or hollow block of conductive material. End conductor 22 is preferably the same diameter as outer conductor 18.

A conductive shield 24 extends from a first point on outer conductor 18 of coaxial line 10 to the distal end of conductor 22; such shield is electrically connected to outer conductor 18 and conductor 22 at these two points. As is well known, shield 24 forms the outer conductor of balanced coaxial lines having outer conductor 18 and end conductor 22 as center conductors; shield 24 isolates conductors 18 and 22 from any external coupling to ground to effect the balancing conversion.

Balanced output lines 12 may extend through small apertures in shield 24 with the aid of insulating gasket spacers 25. The spacing between either end of shield 24 and the end 20 of outer conductor 18 should be one-quarter wavelength at the center of the frequency band of operation.

Although the balun of FIG. 1 operates satisfactorily and has a large bandwidth, mechanical problems are encountered in connection with fabricating the structure shown and effecting the connections of balanced output lines 12 to outer conductor 18 and end conductor 22 inasmuch as the entire outer diameter of line 10 may be 1 millimeter or less; this renders respective connections to the outer and center conductors of such a coaxial line a redoubtable task.

FIG. 2 — IMPROVED BALUN.

According to the invention, it has been discovered that in lieu of end conductor 22, an extension of the coaxial line itself can be used, and both leads 12 need merely be connected to the outer conductor thereof. Coaxial line 10' is extended the full length of outer shield 24 and outer conductor 18' thereof is made discontinuous or severed at the midpoint of shield 24 as indicated at 26, thus leaving an end section 28 of the outer conductor. Section 28 is conductively connected to the distal end of outer shield 24 at 30. Center conductor 16' may extend substantially the full length of shield 24 but should not be electrically connected to the distal end of shield 24.

The structure is very easy to fabricate mechanically since the coaxial dielectric (not shown) will aid in supporting and spacing the outer conductor of the coaxial line from center conductor 16', thus such dielectric should not be severed when the outer conductor is severed at point 26. Both balanced leads 12 are connected to the thusly formed intermediate ends of the outer conductor. Any input signal supplied on the coaxial line will appear on the balanced lines 12 without appreciable attenuation; also the balun has an extremely broad bandwidth capability. As before, severed portion 26 should be spaced one-quarter wavelength at the center of the operating band of frequencies from both the proximal and distal ends of shield 24.

Figure 2:
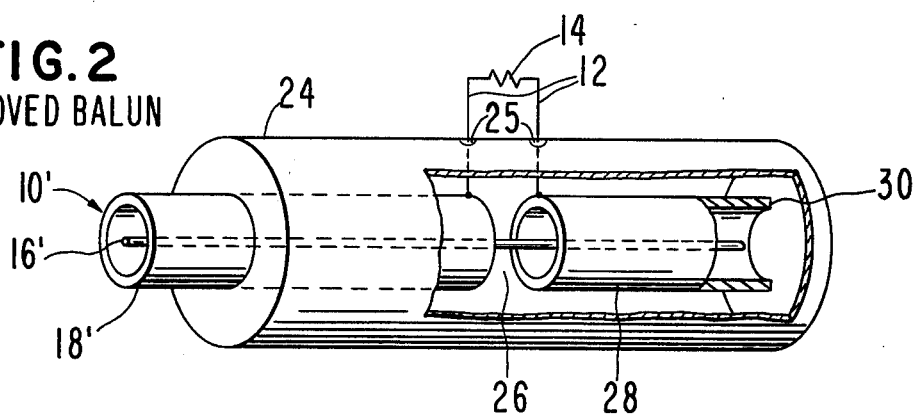
FIG. 2 shows an improved coaxial balun according to the invention.

It should be noted that the improved balun of FIG. 2 does not require any connections to be made to the center conductor of the coaxial line and does not require a special end conductor such as 22 of FIG. 1. A single coaxial cable is used for the entire insides of the balun. The only requirements are that the outer conductor of the coaxial line be severed at the center portion thereof 26 and the end of the outer conductor be conductively joined to the distal end of shield 24.

FIG. 3 — IMPROVED COAXIAL BALUN EMPLOYING ENCLOSURE TYPE SHIELD

Figure 3:
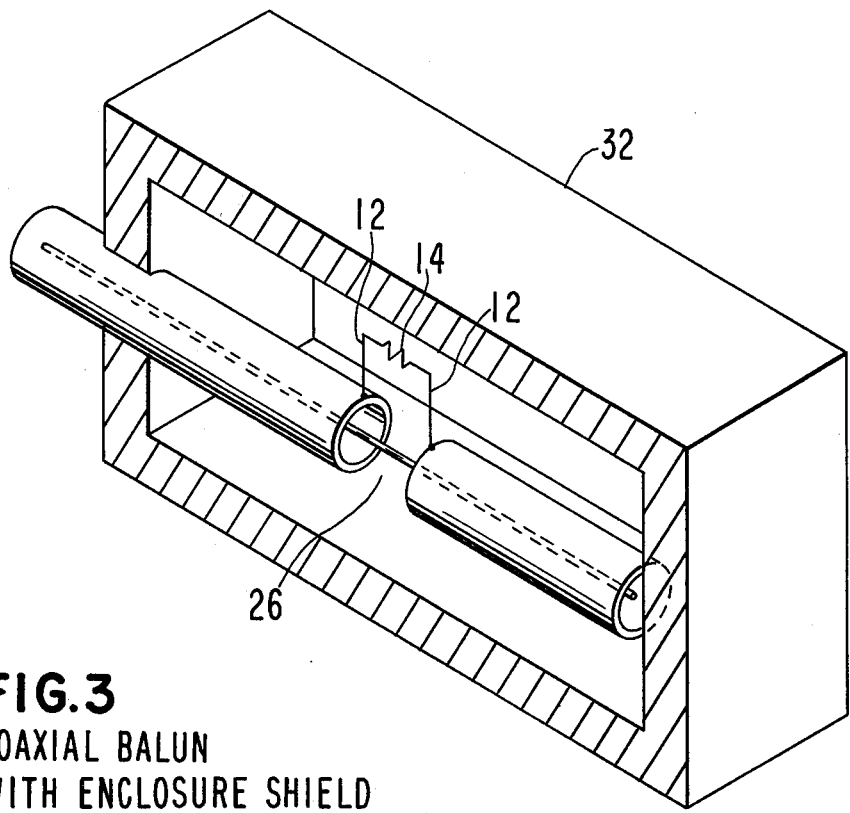
FIG. 3 shows a coaxial balun similar to that of FIG. 2, but with an enclosure-type shield.

In lieu of a bazooka type shield 24, the coaxial balun of FIG. 3 employs an enclosure type shield 32, which is shown in section to illustrate the mounting of the coaxial line therein. The coaxial line is similar to that of FIG. 2, and the severed portion 26 thereof is at the midpoint of shield 32 and one-quarter wavelength from each end of shield 32. Balanced lines 12 and impedance 14 are shown mounted inside shield 32.

Shield 32, in addition to its electrical function of providing a shielding outer conductor for the coaxial line to enable the balanced to unbalanced conversion to be effected, also can house other components, such as load impedance 14, and serves as a rugged carrier for the coaxial line and balun.

FIG. 4 — DOUBLY BALANCED HETERODYNE CONVERTER WITH ORTHOGONAL BALUNS

The doubly balanced heterodyne converter of FIG. 4 employs a pair of coaxial baluns similar to the type shown in FIG. 3, except that a common shield or surrounding enclosure (not shown, but indicated by triangular symbol) is provided for both coaxial lines. The converter of FIG. 4 is shown for exemplary purposes as a first detector for a receiver, that is a detector which combines a radio frequency (RF) input signal 40 with a local oscillator (LO) input signal 42 and provides an intermediate frequency (IF) output signal 44.

The converter of FIG. 4 employs a pair of coaxial lines 46 and 48 which are orthogonally mounted with respect to each other. A center portion of the outer conductor of each coaxial line is removed, but the inner conductor extends through to near the end of the coaxial line. As indicated by the triangular ground symbol 50, the proximal and distal ends of each coaxial line are connected to the surrounding enclosure (not shown). The ends of coaxial line 46 are directly connected to surrounding enclosure 50 and those of coaxial line 48 are capacitively coupled (bypassed) to enclosure 50 as indicated by capacitors 52. RF input signal 40 is supplied to the proximal end of line 46 and LO input signal 42 is supplied to the proximal end of line 48.

Lines 46 and 48 are spaced apart a sufficient distance to position between them a diode quad 54 which is represented by a circular disc with four diodes schematically depicted thereon. Diode quad 54 may comprise a monolithic device having the disc shape indicated with four output conductors thereon, one to each junction of the diode quad. The separated inner ends of the outer conductor of coaxial line 46 are connected to two opposite terminals of the diode quad by conductors 56 and the inner separated ends of coaxial line 48 are connected to the other two opposite terminals of the diode quad by conductors 58.

In operation, the rf input signal 40 supplied on unbalanced line 46 is converted by the coaxial transformer consisting of line 46 in cooperation with surrounding enclosure 50 and is supplied with little attenuation and in broad band fashion on lines 56, which are balanced. In like sense, local oscillator signal 42 is supplied to unbalanced line 48 and is converted by the coaxial transformer consisting of line 48 and surrounding enclosure 50, to a signal on balanced lines 58. The RF and LO signals are both thus supplied in balanced form to respectively opposite junctions of diode quad 54 where they are combined and rectified in well known fashion, enabling an IF output signal 44 to be recovered.

IF output signal is taken across balanced lines 58, i.e., the inner ends of the outer conductor of coaxial line 48, by means of a pair of sections 60 which are a quarter-wavelength long at the LO frequency to prevent shorting out the LO voltage. Sections 60 are connected at their ends distal from the diode quad to form an IF output terminal 62. The ends of coaxial line 48 are capacitively, rather than conductively, coupled to the surrounding enclosure 50 by means of RF bypass capacitors 52 having capacitance sufficient to form virtual short-circuits at the LO frequency, but small enough to present a relatively high impedance to the IF output signal.

While it is not critical, the length of each section of coaxial lines 46 and 48 is preferably one quarter wavelength long at the center of the operating frequency band of each line.

The heterodyne converter of FIG. 4 is thus seen to employ two coaxial baluns which share a common outer enclosure or shield (not shown). The converter is able to effect doubly balanced conversion in a broadband fashion without significant attenuation and while providing very high isolation between RF and LO signals and while inducing very low intermodulation parameters.

FIGS. 5–8 — HARDWARE OF DOUBLY BALANCED HETERODYNE CONVERTER

FIGS. 5 to 8 show in different views one doubly balanced heterodyne converter employing the coaxial baluns of the invention which operated in the satisfactory manner described. The converter of FIGS. 5 to 8 was designed to receive an RF input signal having a nominal frequency of 3.0 GHz and having bandwidth variations of ±1.2 GHz. The LO signal had a frequency of 3 ±1.2 GHz so that the IF output signal had a frequency of ≤ 500 MHz. The entire device is about 4.3 cm square and has a thickness of about 1.3 cm (dimensions of terminals not included).

The device comprises a relatively heavy metal chassis or enclosure 100 (corresponding to enclosure 50 of FIG. 4) and a cover 110 which is shown in partial form only. RF input signal 40 is supplied on a first coaxial input terminal 112 and LO input signal 42 is supplied on a second coaxial input terminal 114. The IF output signal is supplied from a third coaxial terminal 116.

The center conductor 118 of RF input terminal 112 is soldered or bonded to a conductive strip 120 and the outer coaxial terminal of connector 112 is connected to enclosure 100. A coaxial line 122, positioned under an insulating board 124, has a center conductor 126 connected to strip 120 and the outer conductor 128 thereof is connected by means of pressure from a conductive clamp 130 to chassis 100. Coaxial line 122 is interrupted at the center thereof (not shown in FIG. 5 — see detail FIGS. 7 and 8) and the outer conductor only of the distal end thereof is connected to chassis 100 by a second clamp (not shown) near, but not connected to, IF output terminal 116.

Similar connections are made for coaxial line 131 which is coupled to LO input terminal 114, except that its outer conductor is capacitively coupled to chassis 100 by clamps 132 and 134 which have insulating spacers incorporated therein to effect a capacitive, rather than direct, connection. The connections effected by 132 and 134 should each have a capacitance of about 3. pF.

Each coaxial line 122 and 131 is interrupted at the center thereof to provide a pair of intermediate terminals which are connected to the respectively opposite corners of a diode quad 136; details of these connections are shown in FIGS. 7 and 8. The interruption of coaxial line 131 is indicated at 138 and that of coaxial line 122 at 140 in FIG. 6.

A pair of quarter wave lines 141 are joined to the intermediate terminals of coaxial line 131; the ends of lines 140 distal from coaxial line 131 are joined together to form a common IF output line 142 which is connected to the center conductor of IF output terminal 116.

As stated, chassis 100 consists of essentially a solid block of metal (preferably aluminum) which has recesses to accomodate the connections, clamps, and coaxial lines.

Diode quad 136, shown in detail in FIGS. 7 and 8, consists of a substrate 144 having a chip 146 (containing the four diodes) mounted thereon and covered by an epoxy encapsulant 148. Chip 146 has four leads extending therefrom, three of which are shown at 150, 152, and 154.

Coaxial line 131 is connected to leads 150 and 152, respectively, at the ends of the separated portion thereof and coaxial line 122 (FIG. 8) is connected to lead 154 and the other lead (not shown) on the other side of the chip. The insulating chassis spacer or chassis 124 is provided to hold the coaxial lines, the chip, and the other leads in alignment.

While the above description contains many specificities, these should not be construed as limitations on the scope of the invention, but rather as an exemplification of several preferred embodiments thereof. The true scope of the invention should be indicated only by the appended claims and their legal equivalents.

What is claimed is:

1. A heterodyne converter comprising a coaxial line having an elongated inner conductor and a concentric elongated outer conductor separated and insulated from the inner conductor by an intermediate dielectric, said inner conductor receiving a first unbalanced input signal, a conductive shield electrically connected from a first point on the outer conductor of said coaxial line to a second point on said outer conductor spaced from said first point thereon, and substantially surrounding said coaxial line from said first to said second points thereon, said outer conductor of said coaxial line being electrically discontinuous at a point thereon intermediate said first and second points thereon so that said outer conductor has a pair of intermediate ends adjoining the electrical discontinuity thereon, and a pair of balanced lines connected to said intermediate ends of said outer conductor, to supply a balanced version of said first input signal a second coaxial line similar to the first-named coaxial line receiving a second unbalanced input signal on its respective inner conductor, said conductive shield also being connected electrically from a first point on the outer conductor of said second coaxial line to a second point thereon spaced from said first point thereon, said outer conductor of said second coaxial line being electrically discontinuous at a point thereon intermediate said first and second points thereon so as to form a pair of intermediate ends of said outer conductor adjoining the interrupted portion thereof, and a second pair of balanced lines connected to said intermediate ends of said outer conductor to supply a balanced version of said second input signal, and four diodes connected in a bridge circuit, said first and second balanced lines each being connected across opposite corners of said bridge circuit for combining and deriving a heterodyne output from said first and second balanced signals.

2. The invention of claim 1 wherein said conductive shield comprises a rigid enclosure box spaced from but substantially surrounding said first and second coaxial lines from said first to said second points thereon.

3. The invention of claim 1 wherein said first and second coaxial lines are mutually orthogonally oriented and said means for combining and deriving a heterodyne output is positioned between said coaxial lines.

4. The invention of claim 1 further including an output circuit connected across two corners of said bridge circuit, said output circuit comprising a pair of leads, the ends of which remote from said bridge are connected together.

5. The invention of claim 4 wherein said conductive shield is capacitively coupled to said first and second points of said first coaxial line and is directly coupled to said first and second points of said second coaxial line, said output circuit being connected to the corners of said bridge circuit to which said first coaxial line is capacitively connected.

6. A heterodyne converter comprising a conductive enclosure, a first coaxial line leading into said enclosure at one location thereon and extending within said enclosure to a wall opposite said one location, a second coaxial line leading into said enclosure at another location thereon and extending to a wall opposite said other location, the outer conductor of each coaxial line having an electrical discontinuity in the form of an annular gap within said enclosure at a point therein spaced from the entrance of such line into said enclosure, a first pair of balanced lines being connected across said annular gap in said first coaxial line, a second pair of balanced lines being connected across said annular gap in said second coaxial line, a diode bridge positioned within said enclosure, said first and second pairs of balanced lines being connected to opposite corners of said bridge, and means for supplying a heterodyned output signal from said bridge.

7. The converter of claim 6 wherein each coaxial line is orthogonally positioned with respect to, and spaced from, the other coaxial line, said diode bridge being positioned between said two coaxial lines.

8. The converter of claim 6 wherein the outer conductor of each coaxial line is connected to said enclosure at said wall opposite the entrance of its associated line into said enclosure, the inner conductor of each coaxial line being electrically insulated from said wall of said enclosure.

* * * * *